(12) United States Patent
Schaefer

(10) Patent No.: US 10,225,926 B2
(45) Date of Patent: Mar. 5, 2019

(54) CONTACT ARRANGEMENT FOR A MULTI-LAYER CIRCUIT BOARD

(71) Applicant: Robert Bosch GmbH, Stuttgart (DE)

(72) Inventor: Rainer Schaefer, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 280 days.

(21) Appl. No.: 14/652,182

(22) PCT Filed: Oct. 24, 2013

(86) PCT No.: PCT/EP2013/072227
§ 371 (c)(1),
(2) Date: Jun. 15, 2015

(87) PCT Pub. No.: WO2014/090473
PCT Pub. Date: Jun. 19, 2014

(65) Prior Publication Data
US 2016/0198563 A1 Jul. 7, 2016

(30) Foreign Application Priority Data

Dec. 13, 2012 (DE) ................ 10 2012 223 077

(51) Int. Cl.
*H05K 1/11* (2006.01)
*H05K 1/02* (2006.01)
*H05K 3/10* (2006.01)
(52) U.S. Cl.
CPC ......... *H05K 1/0265* (2013.01); *H05K 1/0263* (2013.01); *H05K 1/0298* (2013.01);
(Continued)

(58) Field of Classification Search
CPC ... H01L 21/486; H01L 21/4853; H05K 1/115; H05K 2201/10295; H05K 1/184;
(Continued)

(56) References Cited

U.S. PATENT DOCUMENTS 4,109,296 A * 8/1978 Rostek ................ H01G 2/06
361/303
4,500,389 A 2/1985 Lassen
(Continued)

FOREIGN PATENT DOCUMENTS

| DE | 10108168 | 10/2002 |
| DE | 102006053697 | 5/2008 |
| EP | 1004226 | 5/2000 |

OTHER PUBLICATIONS

International Search Report for Application No. PCT/EP2013/072227 dated Mar. 13, 2014 (English Translation, 2 pages).

*Primary Examiner* — Steven T Sawyer
(74) *Attorney, Agent, or Firm* — Michael Best & Friedrich LLP

(57) ABSTRACT

The invention relates to a contact arrangement (30) for a multi-layer circuit board (1a), said circuit board (1a) having at least one inner wire (2) which is contacted via at least one cutout (10). According to the invention, at least two cutouts (10) are arranged on different sides of the at least one inner wire (2), the center axes (2) of the at least two cutouts (10) having a predefined distance ($a_s$) to a target center line (2.4) of the at least one inner wire (2). The at least two cutouts (10) expose the at least one inner wire (2) in at least two contact zones (2.1) for the purpose of contact, said contact zones being arranged on different sides of the wire (2).

14 Claims, 5 Drawing Sheets

(52) U.S. Cl.
CPC ............ *H05K 1/115* (2013.01); *H05K 3/103* (2013.01); *H05K 2201/0979* (2013.01); *H05K 2201/10287* (2013.01); *H05K 2201/10295* (2013.01)

(58) Field of Classification Search
CPC ......... H05K 2201/10303; H05K 3/306; H05K 3/3405; H05K 3/403; H05K 2201/1034; H05K 1/0296
See application file for complete search history.

(56) References Cited

U.S. PATENT DOCUMENTS

| | | | |
|---|---|---|---|
| 5,934,929 A * | 8/1999 | Saka | H01R 4/2416 439/404 |
| 2002/0170744 A1 | 11/2002 | Morris | |
| 2005/0130463 A1* | 6/2005 | Watanabe | H01R 12/58 439/82 |
| 2007/0232096 A1* | 10/2007 | Schmid | H01R 12/58 439/81 |

* cited by examiner

CONTACT ARRANGEMENT FOR A MULTI-LAYER CIRCUIT BOARD

BACKGROUND OF THE INVENTION

The invention is based on a contact arrangement for a multi-layer circuit carrier, said circuit carrier being in particular suitable for high current applications.

Contact arrangements for a multi-layer circuit carrier typically comprise a contact element and a cut-out that exposes at least one inner-lying metal layer of the multi-layer circuit carrier or rather an inner-lying, current-conducting layer of the multi-layer circuit carrier, said inner-lying metal layer or rather said inner-lying current conducting layer being embodied as a metal sheet and/or as a so-called inlay. The contact element is connected to the at least one inner-lying metal layer or rather to the current-conducting layer in an electrically conductive manner by way of the cut-out to enable contact from the exterior. By way of example, the electrically conductive connection can be produced by way of soldering and/or screws and/or rivets.

A method for producing a printed circuit board and also a printed circuit board of this type is described in the printed patent specification DE 101 08 168 C1. Conductive wires are laid in a defined manner on an inner face of a thin planar element that is embodied from an electrically conductive material of the printed wires and said conductive wires are fastened to and enable contact with defined contact sites of the planar element. A stabilizing planar element is subsequently established in a planar manner on the inner face of the planar element with the contacted, conductive wires. The thin planar element is subsequently structured on its outer face in such a manner that the contact sites are separated from the remaining planar element and as a consequence are electrically insulated. Circuit boards of this type comprising a small thickness can be combined to form a compact multi-layer circuit. Feedthroughs can be provided in the region of the defined contact sites laterally adjacent to the wires in order to provide an electrical connection between the printed circuit boards of a multi-layer circuit carrier

SUMMARY OF THE INVENTION

In contrast thereto, the contact arrangement in accordance with the invention for a multi-layer circuit carrier has the advantage that at least one inner-lying wire can be contacted directly on two different sides from the exterior. A current-conducting layer to enable contact with the wire from the exterior can be omitted in an advantageous manner. Furthermore, it is possible to produce an inner contact region between a current-conducting layer and the at least one wire in an advantageous manner in a region of the wire that is different to the contact region to enable contact with the wire from the exterior. As a consequence, it is possible in an advantageous manner to arrange the inner contact regions and the exterior contacts of the wire independently from one another on the circuit carrier. Furthermore, it is possible in an advantageous manner by means of directly contacting the wire to minimize any loss of power. Since a wire can generally conduct a higher current than the current-conducting layer to which the wire is connected, it is possible in an advantageous manner to transfer higher currents from the exterior to the circuit carrier. As a consequence, it is possible in an advantageous manner to provide a reliable high current contact with the circuit carrier from the exterior.

Embodiments of the present invention provide a contact arrangement for a multi-layer circuit carrier that is preferably used for high current applications. The circuit carrier comprises at least one inner-lying wire that is contacted by way of at least one cut-out. In accordance with the invention, at least two cut-outs are arranged on different sides of the at least one inner-lying wire, wherein the center axes of the at least two cut-outs comprise a predetermined spacing with respect to a desired center line of the at least one inner-lying wire. The at least two cut-outs expose the at least one inner-lying wire to enable contact with at least two contact regions, wherein the at least two contact regions are arranged on different sides of the wire.

The term "a desired center line" is hereinunder understood to mean the line that mirrors the progression of the center of the wire within the circuit carrier. By way of example, if the wire is connected to a current-conducting layer that is embodied in a rectangular manner then the desired center line preferably extends along a center axis of the current-conducting layer so that the wire is preferably arranged centrally on the current-conducting layer that is embodied in a rectangular manner.

It is possible to enable direct contact with the at least one wire by means of the at least two cut-outs, wherein an improved contact from the exterior is also rendered possible in an advantageous manner. As a consequence, it is possible in particular to contact printed circuit carriers, wherein the contact from the exterior can better withstand higher temperatures than by way of example, a contact by way of a current-conducting layer on which is arranged the inner-lying wire. Furthermore, it is possible in an advantageous manner for the inner-lying wire to be exposed and contacted at user-defined regions of the circuit-board. Furthermore, it is possible in an advantageous manner to prevent a bottleneck between a contact element and the inner-lying wire such as would occur in the case of conventional contact arrangements and thus to prevent a related increased ohmic resistance at the contact region. The at least two cut-outs of the circuit carrier to enable contact with the inner-lying wire can be produced by way of example in a simple and cost-effective manner by means of milling and/or laser processing and/or drilling and/or etching.

It is particularly advantageous that the predetermined spacing of the center axes of the at least two cut-outs with respect to the desired center line of the at least one inner-lying wire is reduced corresponding to a tolerance deviation of the at least one inner-lying wire with respect to the desired center line. The predetermined spacing of the center axes with respect to the desired center line can be selected in an advantageous manner in such a manner that the wire is exposed irrespectively of the tolerance deviations at the predetermined contact region. In order to render it possible to contact the inner-lying wire from the exterior without taking into account the tolerance deviations, the maximal possible spacing of the center axis of a cut-out corresponds to the desired center line of the half width of the cut-out plus the half width of the wire. Taking into account the tolerance deviations, the maximal possible spacing of the center axis of a cut-out with respect to the desired center line is reduced by the possible tolerance deviation so that it is ensured that the inner-lying wire is exposed in an advantageous manner, even if said wire is not aligned exactly centrally with respect to the desired center line. In addition, a further overlapping region is taken into account as a part of the tolerance deviation so that even in the extreme case, in other words if the inner-lying wire is arranged on the tolerance limit, it is ensured that the cut-out overlaps with the inner-lying wire.

In one advantageous embodiment of the contact arrangement in accordance with the invention, the spacing between the center axes of the at least two cut-outs can be varied in the case of predefined spacing of the individual cut-outs with respect to the desired center line by way of an alignment angle. It is possible to vary the alignment angle in this case in that the center axes of the cut-outs are displaced parallel to the desired center line. The alignment angle can correspond to the angle between the desired center line and the direct connecting line between the center axes of the cut-outs. The spacing between the center axes of the cut-outs is minimal if the alignment angle between the desired center line and the direct connecting line between the center axes of the cut-outs comprises a value of 90°. In this case, the center axes are arranged lying opposite one another.

In a further advantageous embodiment of the contact arrangement in accordance with the invention, it is possible to embody the walls of the cut-outs in an electrically conductive manner. By way of example, this can be achieved by way of metal plating the cut-out and/or by way of inserting an electrically conductive hole bushing into the cut-out. It is possible to metal plate the cut-out by way of example using a galvanizing process. A direct contact of the inner-lying wire and the corresponding current-conducting layer can be produced by means of the electrically conductive wall. It is possible to contact the inner-lying wire in a simple manner by virtue of the fact that the walls of the cut-out are embodied in an electrically conductive manner and said wire is in physical contact with or rather overlapped by the electrically conductive wall in the contact region.

In a further advantageous embodiment of the contact arrangement in accordance with the invention, the at least two cut-outs can be arranged in the region of a wire end of the at least one inner-lying wire.

In a further advantageous embodiment of the contact arrangement in accordance with the invention, at least one cut-out can be arranged between two inner-lying wires and said cut-out can contact the two inner-lying wires. As a consequence, it is possible in an advantageous manner to produce a connection between two inner-lying wires. In addition, the at least one cut-out can also simultaneously electrically contact two inner-lying wires that are arranged in different planes of the circuit carrier. Furthermore, it is possible to reduce the amount of material and/or layout area required if one cut-out exposes two inner-lying wires to enable contact from the exterior with the same potential.

In a further advantageous embodiment of the contact arrangement in accordance with the invention, it is possible in each case to arrange a contact element within a cut-out. It is possible in an advantageous manner to connect the contact element to the at least one inner-lying wire in an electrically conductive manner by way of the cut-out. In an advantageous manner, one positive locking connection and/or one non-positive locking connection of the contact element to the exposed contact region of the wire is sufficient so that it is possible to omit further contacts. Since the wall of the cut-out is embodied in an electrically conductive manner and is connected to the exposed contact region of the wire, the contact element contacts the wire in an advantageous manner indirectly by way of the electrically conductive wall.

In a further advantageous embodiment of the contact arrangement in accordance with the invention, it is possible to force fit and/or to solder the contact element into the corresponding cut-out. This renders it possible for the at least one inner-lying wire to be contacted from the exterior in a cost-effective and reliable manner, said wire being exposed by way of the cut-out. During the force fitting process, it is possible as a result of the cold welding process to produce a material connection to the hole bushing or rather to the electrically conductive wall and as a consequence render it possible to directly access the inner-lying wire by way of the bushing or rather the wall. It is possible to provide the direct access by way of the solder during the soldering process. In this manner, it is possible to connect and/or couple the contact element in a reliable manner directly and/or indirectly to the corresponding contact region of the at least one inner-lying wire, wherein this connection and/or coupling process is suitable in an advantageous manner for high current applications.

In a further advantageous embodiment of the contact arrangement in accordance with the invention, it is possible to mutually connect two contact elements by way of a connecting piece and form a double pin. In an advantageous manner, it is possible by way of a double pin to conduct higher currents to the wire and/or to improve the current-conducting capability of the contact arrangement.

In a further advantageous embodiment of the contact arrangement in accordance with the invention, it is possible to adjust the spacing between the center axes of the at least two cut-outs by way of the alignment angle to a predetermined spacing between the contact elements of the double pin. It is possible in an advantageous manner to use an embodiment of a double pin having a predetermined connecting piece length and a predetermined spacing between the contact elements to enable contact with an inner-lying wire in that the spacing between the center axes of the cut-outs is adjusted to the necessary spacing between the contact elements. In an advantageous manner, it is possible to use one embodiment of the double pin in different circuit carriers to enable contact with the inner-lying wire and/or the inner wires from the exterior, wherein the process of producing the contact arrangement can be made easier by virtue of minimizing the number of different embodiments of the double pin since it is possible to use one embodiment of the double pin as a result of an inclined position of the cut-outs to enable contact with different inner-lying wires from the exterior, said cut-outs by way of example comprising different widths.

Exemplary embodiments of the invention are illustrated in the drawings and are further explained in the following description. In the drawings, like reference numerals describe like components or rather elements that perform identical or rather similar functions.

DETAILED DESCRIPTION

Figure 1:
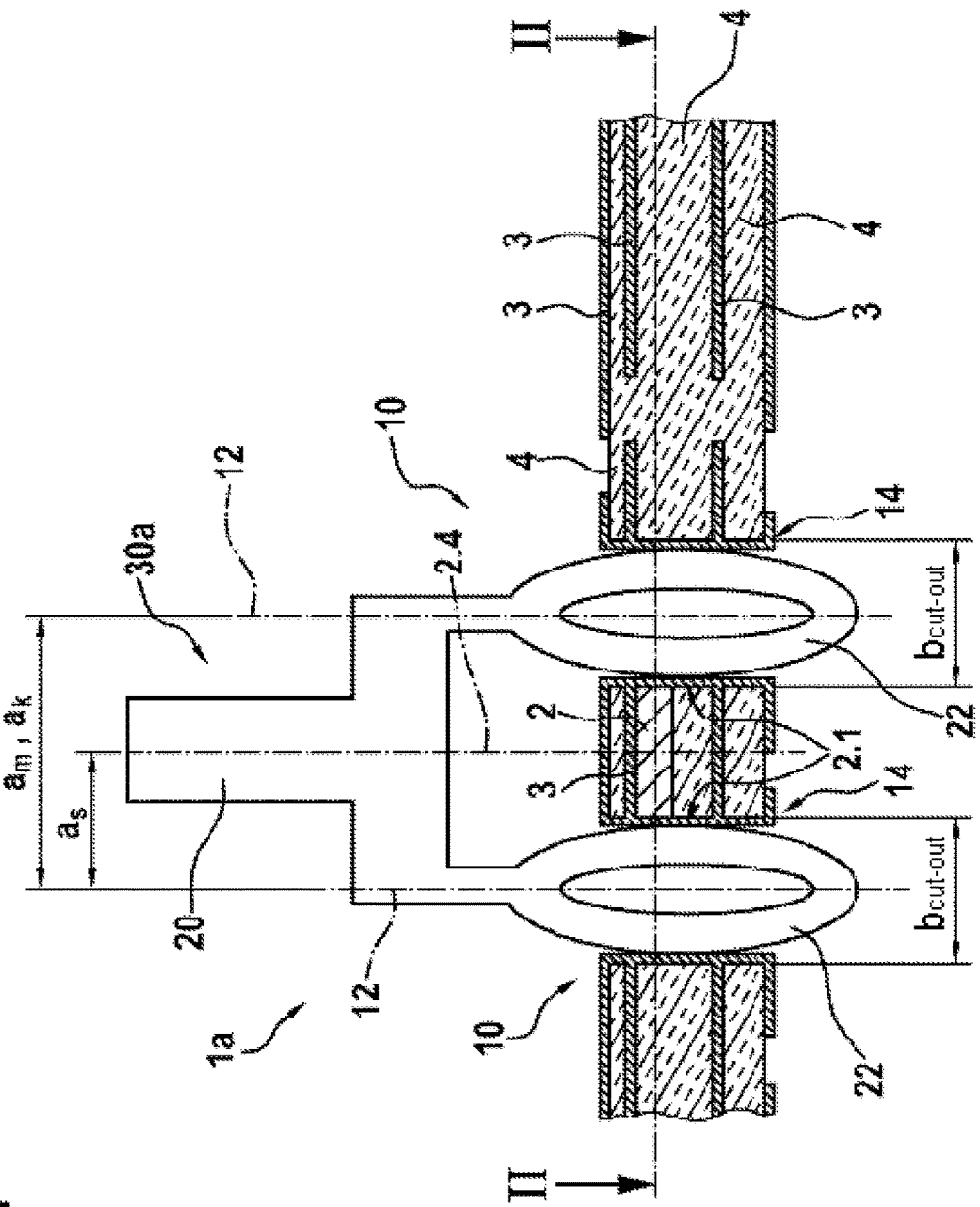
FIG. 1 illustrates a schematic cross section of a first exemplary embodiment of a multi-layer circuit carrier having a contact arrangement in accordance with the invention.

Multi-layer circuit carriers generally comprise at least one inner-lying, current-conducting layer by way of which a component that is connected to the circuit carrier is supplied with current. In order to increase the current-conducting capability of the multi-layer circuit carrier, the multi-layer circuit carrier comprises inner-lying wires that by way of example are attached to the inner-lying, current-conducting layer. By way of example, the inner-lying, current-conducting layer can be embodied as a copper foil. Circuit carriers that comprise wires to increase the current-conducting capability are typically described as printed circuit boards.

Typical contact arrangements for a multi-layer, printed circuit carrier that comprises at least one inner-lying wire comprise at least one cut-out by way of which an inner-lying, current-conducting layer of the circuit carrier is contacted, said current-conducting layer being connected in an electrically conductive manner to the inner-lying wire. Alternatively, the inner-lying, current-conducting layer to which is connected the inner-lying wire is guided in a contact region by way of the cut-out towards the exterior and away from the region that is connected to the inner-lying wire, wherein the protruding part of the current-conducting layer is contacted from the exterior. The inner-lying wire that is connected to the current-conducting layer is contacted by the current-conducting layer.

As is evident in FIGS. 1 to 5, the illustrated exemplary embodiments of a multi-layer circuit carrier 1a, 1b, 1c, 1d comprise in each case at least one inner-lying, current-conducting layer 3. The at least one inner-lying, current-conducting layer 3 is preferably embodied as metal foil, in particular as copper foil. In lieu of copper, it is also possible to use another material having similar good electrical and thermal conducting capabilities. In order to increase the current-conducting capability of the multi-layer circuit carrier 1a, 1b, 1c, 1d, the multi-layer circuit carrier 1a, 1b, 1c, 1d comprises at least one inner-lying, electrically conductive wire 2 that is attached by way of example to the at least one inner-lying, current-conducting layer 3. The at least one inner-lying wire 3 is in particular suitable for conveying high currents such as by way of example in the case of high current applications. Furthermore, the inner-lying wire 3 can be embodied in a cylindrical or cuboidal manner. Furthermore, the inner-lying wire 3 can comprise an insulating casing (not illustrated), wherein the insulating casing of the inner-lying wire 3 is recessed at the predetermined inner contact regions 3.1 with the inner-lying current-conducting layer 3. In addition, it is possible for the inner-lying wire 3 to be part of a wire grid that is arranged in the circuit carrier 1a, 1b, 1c, 1d.

The exemplary embodiments of a multi-layer circuit carrier 1a, 1b, 1c that are illustrated in FIGS. 1 to 4 illustrate in each case an inner-lying wire 2 that is arranged on a corresponding inner-lying, current-conducting layer 3. The exemplary embodiment of a multi-layer circuit carrier 1d that is illustrated in FIG. 5 illustrates three inner-lying wires 2 that in each case are arranged on an inner-lying, current-conducting layer 3.

As is further evident in FIGS. 1 to 5, the inner-lying wires 2 are connected in each case at a first contact region 3.1 to a corresponding inner-lying, current-conducting layer 3 in an electrically conductive manner. In a preferred embodiment, the first contact region 3.1 is embodied as a weld spot, wherein the inner-lying, current-conducting layer 3 is wider in the region of the first contact region 3.1 than in the subsequent progression. Furthermore, the at least one current-conducting layer 3 and the corresponding inner-lying wire 2 are laminated between organic substrates that form insulating layers 4. A surface of the multi-layer circuit carrier 1a is embodied in a structured manner, as illustrated in FIG. 1, and comprises electrically conductive layers 3 or rather regions and electrically insulating layers 4 or rather regions.

As is further evident in FIGS. 1 to 5, a contact arrangement 30a, 30b, 30c, 30d for the multilayer circuit carrier 1a, 1b, 1c, 1d comprises in each case at least one cut-out 10 that exposes the inner-lying, current-conducting layer 3 of the multi-layer circuit carrier 1a, 1b, 1c, 1d.

In accordance with the invention, the contact arrangement 30a, 30b, 30c, 30d comprises at least two cut-outs 10 that are arranged on different sides of the at least one inner-lying wire 2, wherein the center axes 12 of the at least two cut-outs 10 comprise a predetermined spacing as with respect to a desired center line 2.4 of the at least one inner-lying wire 2.

The desired center line 2.4 is defined as the line that mirrors the desired progression of the wire 2 within the circuit carrier 1a, 1b, 1c, 1d, wherein the center of the wire 2 in the ideal scenario extends congruent with the desired center line 2.4. That means that the wire 2 having a width b overlaps the desired center line 2.4 in the ideal scenario on both sides of the desired center line 2.4 to an identical extent.

In preferred embodiments that are illustrated in FIGS. 1 to 5, the wire 2 and the current-conducting layer 3 are aligned in an axially symmetrical manner with respect to the desired center line 2.4. In illustrated exemplary embodiments, the wire 2 is connected to a rectangular embodied current-conducting layer 3, wherein the desired center line 2.4 extends along a center axis of the current-conducting layer 3 so that the wire 2 is arranged centrally on the rectangular embodied current-conducting layer 3.

The at least two cut-outs 10 expose the at least one inner-lying wire 2 to enable contact from the exterior at at least two further contact regions 2.1, wherein the contact regions 2.1 are arranged on different sides of the wire 2.

As is evident from FIGS. 1 to 5, the predetermined spacing $a_s$ of the center axes 12 in the illustrated exemplary embodiments is identical for the two cut-outs 10. As a consequence, a maximal spacing $a_{smax}$ between the center axes 12 of the respective cut-out 10 and the desired center line 2.4 is calculated without tolerance deviation in accordance with equation (1). The maximal spacing $a_{smax}$ is determined without tolerance deviation in such a manner that the respective cut-out 10 still exposes the inner-lying wire 2 at the predetermined contact region 2.1.

$$a_{smax} = \left(\frac{1}{2}b_{wire} + \frac{1}{2}b_{cut-out}\right) \quad (1)$$

In this case $b_{wire}$ represents the width or rather the diameter of the inner-lying wire 2 and $b_{cut-out}$ represents the width or rather the diameter of the cut-out 10.

In order to render it possible to reliably expose the wire 2, even if said wire is not aligned exactly centrally with respect to the desired center line 2.4, the maximal possible spacing $a_{smax}$ is reduced by the amount of the tolerance deviation $\Delta a$ about which the center of the inner-lying wire 2 can deviate from the desired center line 2.4. As a consequence, the spacing between the center axes 12 of the respective cut-out 10 and the desired center line 2.4 is determined in accordance with equation (2).

$$a_s = a_{smax} - \Delta a = \left(\frac{1}{2}b_{wire} + \frac{1}{2}b_{cut\text{-}out}\right) - |\Delta a| \quad (2)$$

As a consequence, the predetermined spacing as of the center axes 12 with respect to the desired center line 2.4 of the at least one inner-lying wire 2 in the case of the illustrated exemplary embodiments takes into account the tolerance deviation of the at least one inner-lying wire 2 with respect to the desired center line 2.4. By way of example, the inner-lying wires 2 can comprise a width $b_{wire}$ of approx. 1.4 mm. These wires 2 can be laid with a tolerance deviation Δa of approximately +/−0.2 mm with respect to the desired center line 2.4. By taking into account the tolerance deviation in the case of determining the predetermined spacing as of the center axes 12 with respect to the desired center line 2.4, it is ensured that the wire 2 is exposed even if said wire does not extend exactly on the desired center line 2.4. In addition, a further overlapping region a is taken into account as a part of the tolerance deviation so that even in the extreme case, in other words the inner-lying wire 2 is arranged on the tolerance limit, it is ensured that the cut-out 10 overlaps the inner-lying wire 2. In the illustrated exemplary embodiment, the additional overlapping region a can amount by way of example to 0.1 mm so that in the above described numerical example altogether an amount of 0.3 mm is taken into account as the tolerance deviation Δa.

As is further evident in FIGS. 1 to 5, the walls of the cut-outs 10 are embodied in an electrically conductive manner. In the illustrated exemplary embodiments, the wall is embodied from an electrically conductive hole bushing 14 that is in physical contact with the inner-lying wire 2 in the corresponding contact region 2.1.

As is further evident in FIGS. 1 to 5, the contact arrangement 30a, 30b, 30c, 30d comprises two contact elements 22, wherein in each case a contact element 22 is arranged within a cut-out 10. The contact element 22 is force fit and/or soldered into the corresponding cut-out 10. Furthermore, the contact elements 22 are mutually connected by way of a connecting piece 24 and form a double pin 20. The contact elements 22 that are illustrated in FIG. 1 are embodied in a hollow manner and are resilient so that the contact elements 22 yield during insertion into the cut-out 10 and can press with a predetermined force against the wall of the hole bushing 14.

The circuit carriers 1a, 1b, 1c, 1d that are illustrated in FIGS. 1 to 5 differ as a result of the design and/or the position of the respective contact arrangement 30a, 30b, 30c and 30d.

Figure 2:
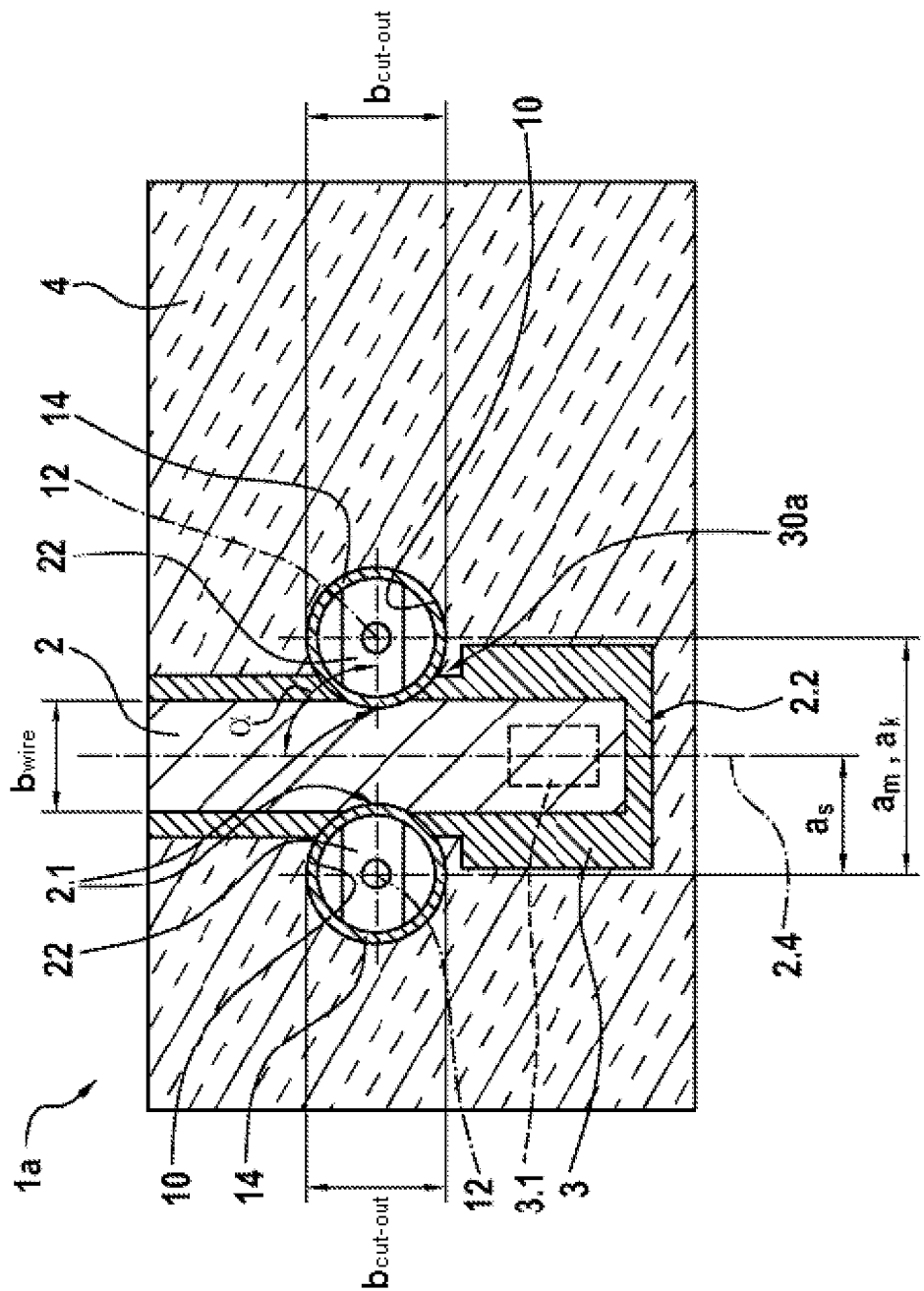
FIG. 2 illustrates a schematic a cross section of the first exemplary embodiment of a multi-layer circuit carrier having a contact arrangement in accordance with the invention along the line II-II in FIG. 1.

The first exemplary embodiment of the circuit carrier 1a that is illustrated in FIGS. 1 and 2 comprises a contact arrangement 30a whose cut-outs 10 are aligned before the end region 2.2 of the inner-lying wire 2 with an alignment angle α of 90° between the desired center line 2.4 and the direct connecting line between the center axes 12 of the cut-outs 10. By virtue of the alignment angle α of 90°, the spacing $a_m$ between the center axes 12 of the two cut-outs 10 is minimal and the cut-outs 10 lie opposite one another.

Figure 3:
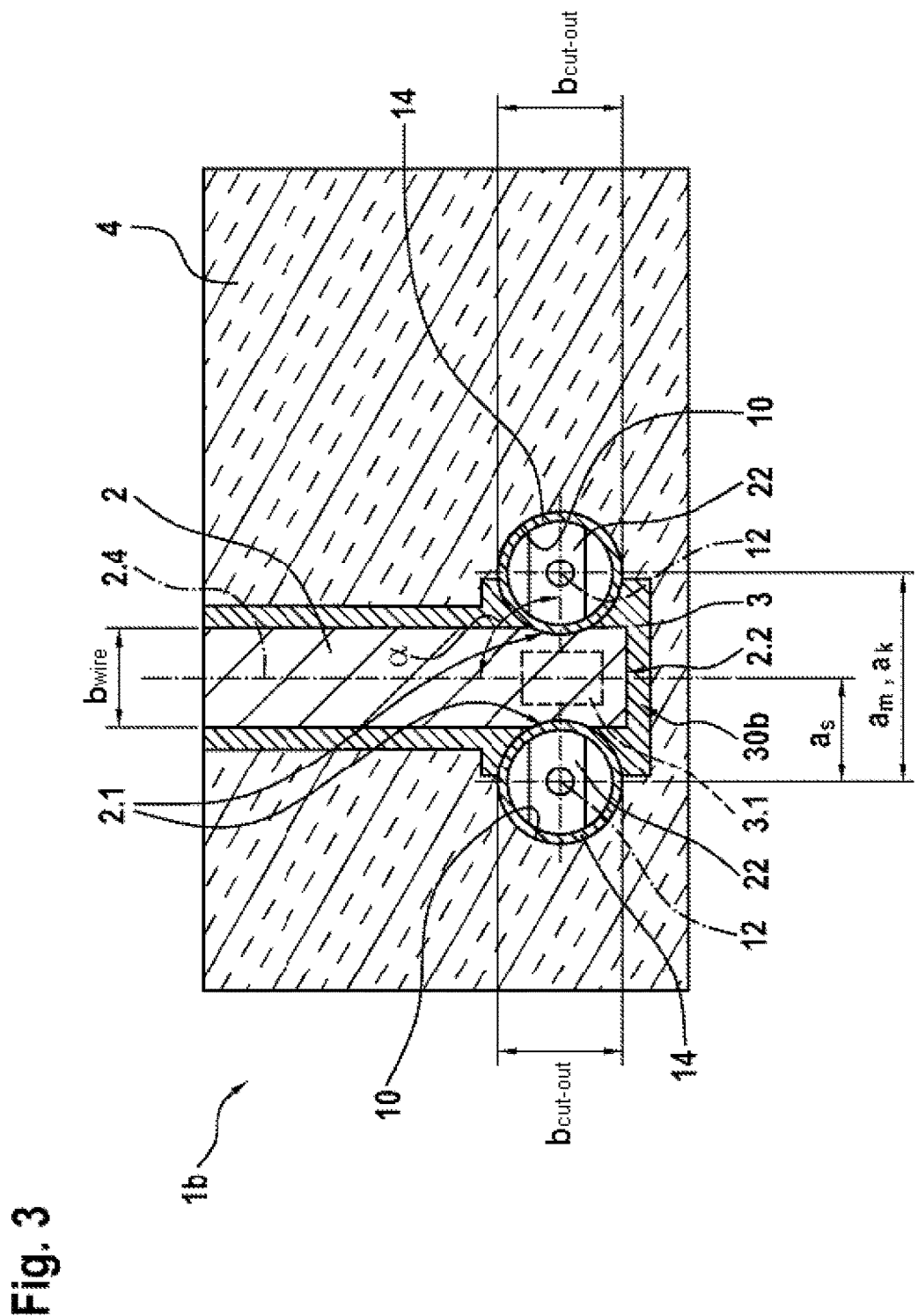
FIG. 3 illustrates a schematic cross section of a second exemplary embodiment of a multi-layer circuit carrier having a second exemplary embodiment of a contact arrangement in accordance with the invention.

In the case of the second exemplary embodiment of the circuit carrier 1b that is illustrated in FIG. 3, the inner-lying wire 2 is exposed at an end region 2.2 of the wire 2. That means that the illustrated circuit carrier 1b comprises a contact arrangement 30b whose cut-outs 10 are arranged on the end region 2.2 of the inner-lying wire 2. The cut-outs 10 are similar to the first exemplary embodiment with an alignment angle α of 90° between the desired center line 2.4 and the direct connecting line between the center axes 12 of the cut-outs 10 and comprise a minimal spacing $a_m$ with respect to one another.

Figure 4:
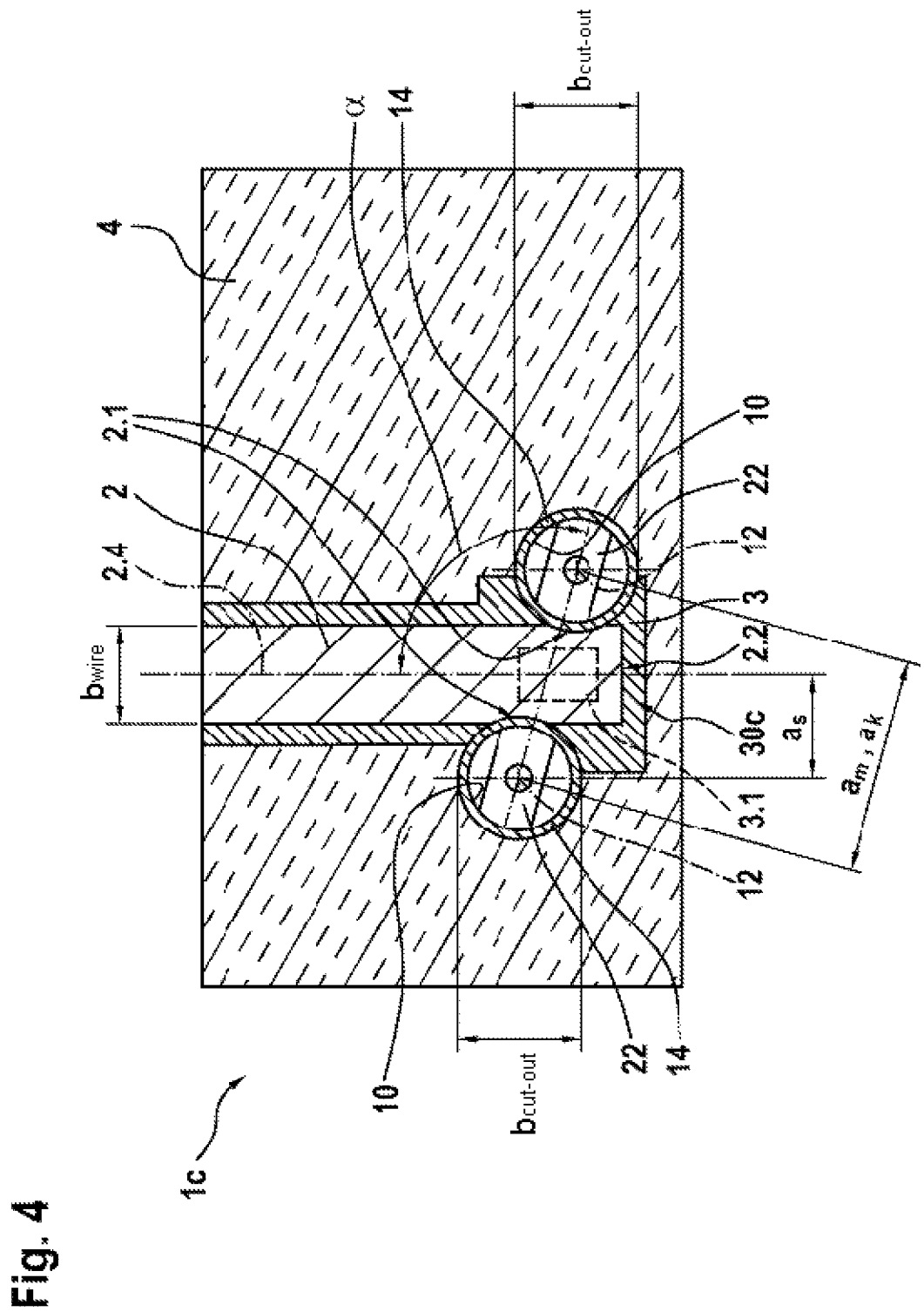
FIG. 4 illustrates a schematic cross section of a third exemplary embodiment of a multi-layer circuit board having a third embodiment of the contact arrangement in accordance with the invention.
Figure 5:
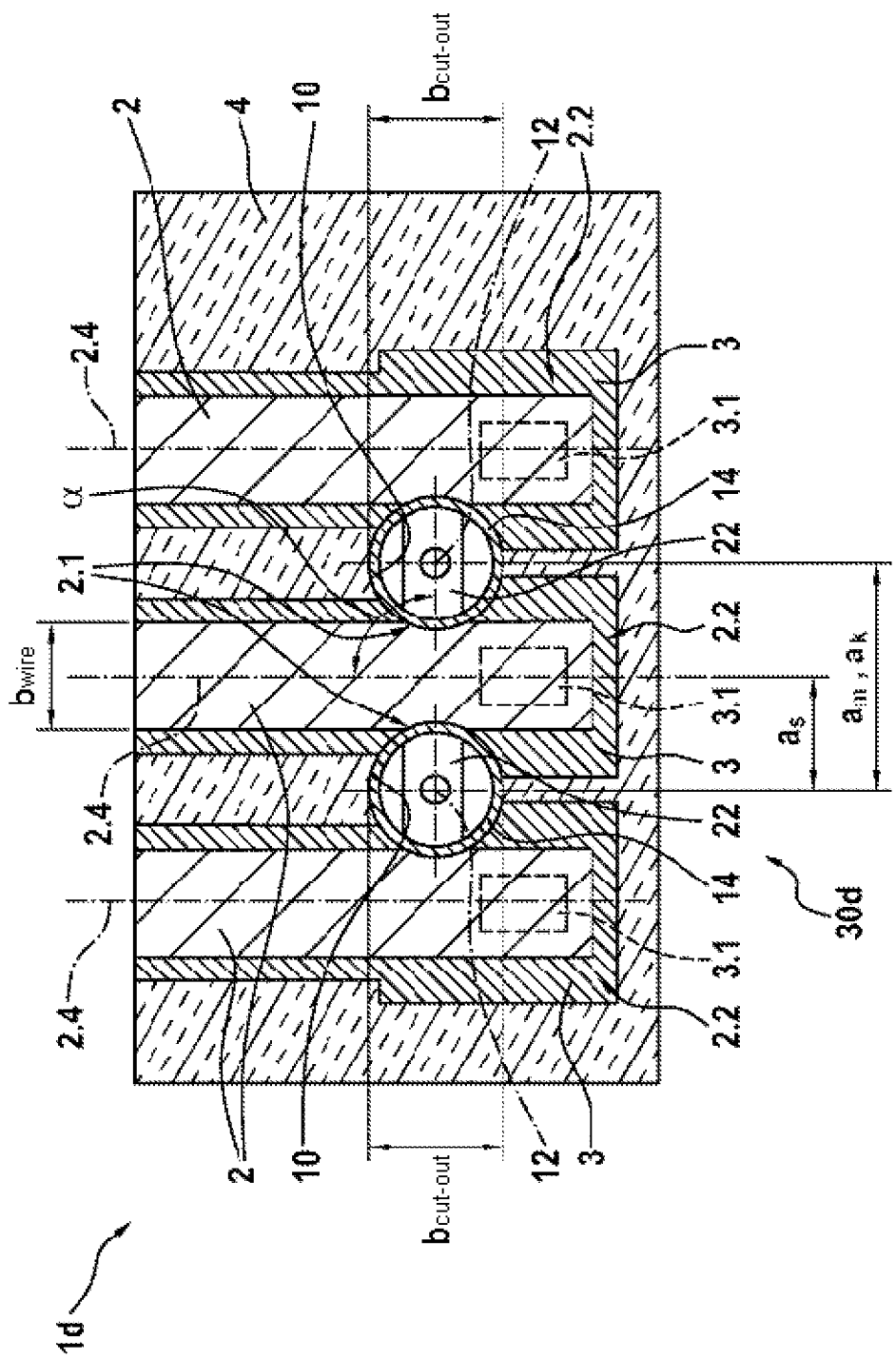
FIG. 5 illustrates a schematic cross section of a fourth exemplary embodiment of a multi-layer circuit carrier having a fourth exemplary embodiment of a contact arrangement in accordance with the invention.

The third exemplary embodiment of the circuit carrier 1c that is illustrated in FIG. 4 comprises a contact arrangement 30c whose cut-outs 10 are aligned on the end region 2.2 of the inner-lying wire 2 with an alignment angle α between the desired center line 2.4 and the direct connecting line between the center axes 12 of the cut-outs 10 that is greater than 90°. It is possible to adjust the spacing $a_m$ between the center axes 12 of the two cut-outs 10 by way of the alignment angle α to a predetermined spacing $a_k$ between the contact elements 22 of the double pin 20. The alignment angle α corresponds to the angle between the desired center line 2.4 and the connecting line between the center axes 12 of the cut-outs 10. The spacing $a_m$ between the center axes 12 of the at least two cut-outs 10 in the case of the predetermined spacing $a_s$ can be varied with respect to the desired center line 2.4 by way of the alignment angle α in that the cut-outs 10 are displaced parallel to the desired center line 2.4 in the opposite direction. The double pin 20 is arranged in an inclined manner so that the contact elements 22 of the double pin 20 can be inserted into the offset cut-outs 10 of the contact arrangement 30c.

The fourth exemplary embodiment of the circuit carrier 1d that is illustrated in FIG. 5 comprises two wires 2, wherein the two cut-outs 10 of the contact arrangement 30d are arranged between two inner-lying wires 2 and contacts the two wires 2. As a consequence, the wire 2 that is arranged between the two other wires 2 is contacted on both sides by way of the contact elements 22, wherein the outer-lying wires 2 are connected to the center wire 2 by way of in each case a cut-out 10 and the corresponding contact element 22.

In the case of the fourth exemplary embodiment of the circuit carrier 1d that is illustrated in FIG. 5, the cut-outs 10 of the contact arrangement 30d are arranged on the end region 2.2 of the inner-lying wires 2. The cut-outs 10 are aligned similar to the first and second exemplary embodiment with an alignment angle α of 90° between the desired center line 2.4 of the center wire 2 and the direct connecting line between the center axes 12 of the cut-outs 10 and comprise a minimal spacing $a_m$ with respect to one another.

FIGS. 1 to 5 illustrate the multi-layer circuit carrier 1a, 1b, 1c, 1d in each case with only one contact arrangement 30a, 30b, 30c, 30d. Of course, the multi-layer circuit carriers 1a, 1b, 1c, 1d can comprise a user-defined number of contact arrangements 30a, 30b, 30c, 30d.

Embodiments of the present invention provide a contact arrangement for a multi-layer circuit carrier that is preferably used in high current applications. The contact arrangement in accordance with the invention renders it possible to enable high current contact with the inner-lying wires of the circuit carrier from the exterior in a simple, reliable and direct manner to supply and accordingly discharge high currents.

What is claimed is:

1. A contact arrangement for a multi-layer circuit carrier (1a, 1b, 1c, 1d), wherein the circuit carrier (1a, 1b, 1c, 1d) comprises at least one inner-lying wire (2) that is contacted by way of at least one cut-out (10), characterized in that at least two cutouts (10) are spaced apart on different sides of the at least one inner-lying wire (2), wherein at least one of the cut-outs (10) receives a contact element (22), wherein center axes (12) of the at least two cut-outs (10) comprise a predetermined spacing (as) with respect to a desired center line (2.4) of the at least one inner-lying wire (2), wherein the at least two cut-outs (10) expose the at least one inner-lying wire (2) to enable contact with at least two contact regions (2.1) that are arranged on different sides of the inner-lying wire (2), whereby, the contact element (22) is connected to the inner-lying wire (2) in an electrically conductive manner.

2. The contact arrangement as claimed in claim 1, characterized in that the predetermined spacing ($a_s$) of the center axes (12) of the at least two cut-outs (10) with respect to the desired center line (2.4) of the at least one inner-lying wire (2) is reduced corresponding to a tolerance deviation (Δa) of the at least one inner-lying wire (2) with respect to the desired center line (2.4).

3. The contact arrangement as claimed in claim 1, characterized in that a spacing ($a_m$) between the center axes (12) of the at least two cut-outs (10) can be varied in the case of the predetermined spacing ($a_s$) with respect to the desired center line (2.4) by way of an alignment angle (α).

4. The contact arrangement as claimed in claim 1, characterized in that the walls of the cut-outs (10) are embodied in an electrically conductive manner.

5. The contact arrangement as claimed in claim 1, characterized in that the at least two cut-outs (10) are arranged in a region of a wire end (2.2) of the at least one inner-lying wire (2).

6. The contact arrangement as claimed in claim 1, characterized in that at least one cut-out (10) is arranged between two inner-lying wires (2) and contacts the two wires (2).

7. The contact arrangement as claimed in claim 1, characterized in that two contact elements (22) are inserted in respective ones of the two cut-outs (10).

8. The contact arrangement as claimed in claim 7, characterized in that each of the contact elements (22) is force fitted and/or soldered into a corresponding cut-out (10).

9. The contact arrangement as claimed in claim 7, characterized in that the two contact elements (22) are mutually connected by way of a connecting piece (24) and form a double pin (20).

10. The contact arrangement as claimed in claim 9, characterized in that a spacing ($a_m$) between the center axes (12) of the at least two cut-outs (10) is adjusted by way of an alignment angle (α) to a predetermined spacing ($a_k$) between the contact elements (22) of the double pin (20).

11. The contact arrangement as claimed in claim 1, wherein one of the at least two contact regions (2.1) includes a wall embodied from an electrically conductive hole bushing (14).

12. The contact arrangement as claimed in claim 11, wherein the at least one inner-lying wire (2) is in physical contact with an exterior of the electrically conductive hole bushing (14), and wherein the contact element is in physical contact with an interior of the bushing.

13. The contact arrangement as claimed in claim 7, wherein the at least two contact regions (2.1) each include a wall embodied from an electrically conductive hole bushing (14).

14. The contact arrangement as claimed in claim 13, wherein the at least one inner-lying wire (2) is in physical contact with an exterior of the electrically conductive hole bushing (14) in each of the contact regions, and wherein each of the contact elements is in physical contact with an interior of the bushing in the respective one of the cut-outs.

* * * * *